(12) United States Patent
Tsujita

(10) Patent No.: US 9,291,903 B2
(45) Date of Patent: Mar. 22, 2016

(54) FORMING METHOD AND SUBSTRATE

(71) Applicant: CANON KABUSHIKI KAISHA, Tokyo (JP)

(72) Inventor: Koichiro Tsujita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 16 days.

(21) Appl. No.: 14/322,117

(22) Filed: Jul. 2, 2014

(65) Prior Publication Data

US 2015/0017397 A1 Jan. 15, 2015

(30) Foreign Application Priority Data

Jul. 9, 2013 (JP) .................................. 2013-143895

(51) Int. Cl.
*H01L 21/76* (2006.01)
*H01L 23/544* (2006.01)
*G01B 11/00* (2006.01)
*G03F 7/20* (2006.01)

(52) U.S. Cl.
CPC .............. *G03F 7/2051* (2013.01); *G03F 7/70* (2013.01); *H01L 23/544* (2013.01); *H01L 2223/5446* (2013.01); *H01L 2223/54426* (2013.01); *Y10T 428/24802* (2015.01)

(58) Field of Classification Search
CPC ..................... H01L 23/544; H01L 2223/5446; H01L 2223/54426
USPC ..................... 438/401; 257/797; 356/399, 401
See application file for complete search history.

(56) References Cited

U.S. PATENT DOCUMENTS

| 6,514,647 | B1 * | 2/2003 | Hinogami | ........... G03F 7/70633 430/22 |
| 6,667,212 | B1 | 12/2003 | Shiraiwa et al. | |
| 6,921,916 | B2 * | 7/2005 | Adel | .................. G03F 7/70633 257/48 |
| 7,081,374 | B2 | 7/2006 | Yamaguchi | |

(Continued)

FOREIGN PATENT DOCUMENTS

| CN | 1973371 A | 5/2007 |
| JP | 2007049067 A | 2/2007 |

(Continued)

OTHER PUBLICATIONS

Atsushi Ueno, et al "Novel at-Design-Rule Via-to-Metal Overlay Metrology for 193-nm Lithography", IEEE Transactions on Semiconductor Manufacturing, vol. 17, No. 3, pp. 311-316, Aug. 2004.

(Continued)

*Primary Examiner* — Karen Kusumakar
(74) *Attorney, Agent, or Firm* — Rossi, Kimms & McDowell LLP

(57) ABSTRACT

The present invention provides a method of forming a detection mark from line patterns formed on a substrate, including a first step of deciding a first region for forming the detection mark on the substrate, and a second region which surrounds the first region and in which formation of the detection mark is forbidden, and a second step of projecting, onto the substrate by a projection optical system, patterns including a first cut pattern for partially cutting the line pattern in the first region to form a plurality of mark elements, and a removal pattern for removing the line pattern in the second region, and forming the detection mark including the plurality of mark elements.

14 Claims, 13 Drawing Sheets

(56) References Cited

U.S. PATENT DOCUMENTS

| | | | |
|---|---|---|---|
| 7,880,880 B2* | 2/2011 | Van Bilsen | G03F 9/7046 |
| | | | 250/237 G |
| 8,115,938 B2 | 2/2012 | Van Haren | |
| 2001/0001502 A1* | 5/2001 | Wong | G02F 1/13454 |
| | | | 257/620 |
| 2001/0022405 A1* | 9/2001 | Kajita | G03F 7/0035 |
| | | | 257/797 |
| 2001/0033033 A1* | 10/2001 | Yao | H01L 23/544 |
| | | | 257/797 |
| 2001/0041417 A1* | 11/2001 | Ohsaki | G03F 9/7049 |
| | | | 438/401 |
| 2005/0079683 A1* | 4/2005 | Sarma | G03F 9/7076 |
| | | | 438/401 |
| 2005/0286052 A1 | 12/2005 | Huggins et al. | |
| 2006/0131576 A1* | 6/2006 | Koh | G03F 7/70633 |
| | | | 257/48 |
| 2007/0031743 A1* | 2/2007 | Bijnen | G03F 9/7076 |
| | | | 430/22 |
| 2010/0197105 A1* | 8/2010 | Uchiyama | G03F 9/7076 |
| | | | 438/401 |
| 2011/0089581 A1* | 4/2011 | Pol | H01L 23/544 |
| | | | 257/797 |

FOREIGN PATENT DOCUMENTS

| | | |
|---|---|---|
| JP | 2012164704 A | 8/2012 |
| TW | 200943007 A | 10/2009 |
| TW | 201125077 A | 7/2011 |

OTHER PUBLICATIONS

Michael C. Smayling, et al "32nm and below Logic Patterning using Optimized Illumination and Double Patterning", Proc of SPIE vol. 7274, 2009.

Chinese Office Action issued in counterpart application No. CN201410323975.8, dated Dec. 21, 2015. English Translation provided.

Taiwanese Office Action issued in counterpart application No. TW103121713, dated Jan. 21, 2016.

\* cited by examiner

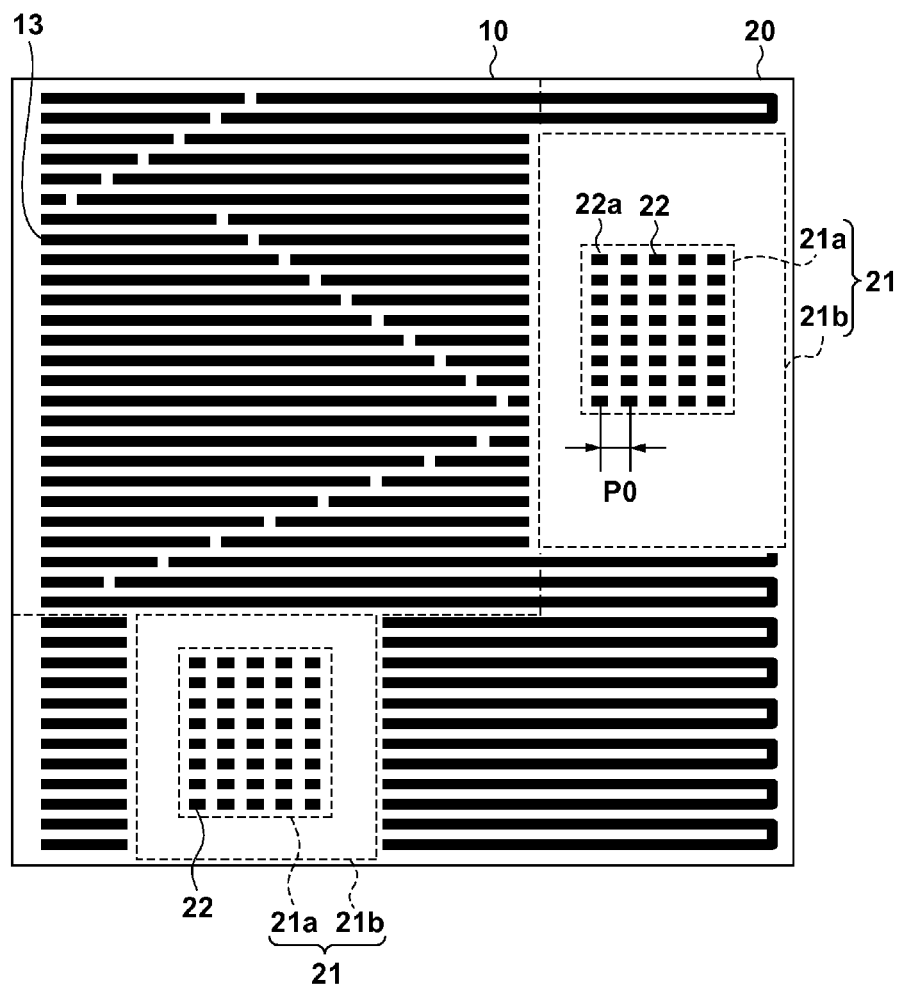
F I G. 3

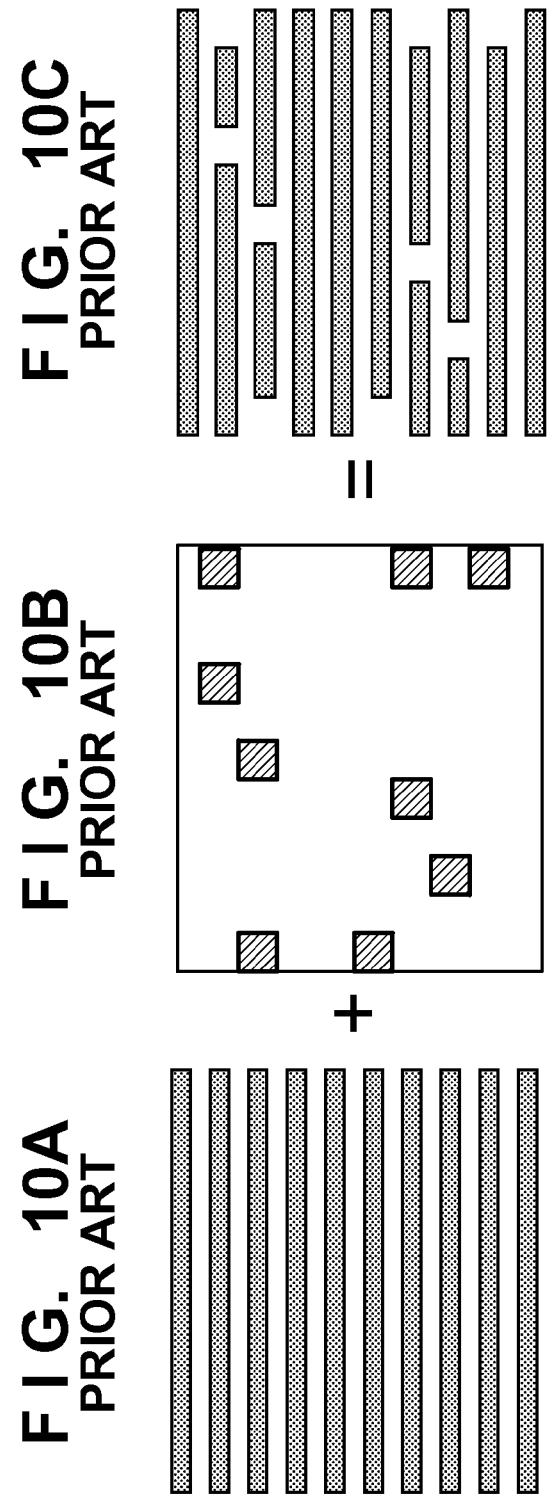

FORMING METHOD AND SUBSTRATE

BACKGROUND OF THE INVENTION

1. Field of the Invention

The present invention relates to a forming method of forming a detection mark on a substrate, and a substrate.

2. Description of the Related Art

Along with micropatterning of devices, the fidelity (pattern accuracy) of a pattern (design pattern) transferred to a substrate tends to decrease. This becomes prominent when a pattern with a two-dimensional shape is transferred to a substrate. To solve this, a technique of constituting, by only patterns of one-dimensional shapes, a pattern to be transferred to a substrate, that is, a so-called 1D layout has been proposed in "M. Smayling, '32 nm and below Logic Patterning using Optimized Illumination and Double Patterning' Proc. SPIE 7244, (2009)".

In a 1D layout, lines and spaces (L/Ss) shown in FIG. 10A are formed on the entire substrate. The L/Ss are partially cut based on cut patterns shown in FIG. 10B, thereby forming circuit elements (transistors) shown in FIG. 10C. This process is mainly applied to a gate process and metal process, and the process applied to the gate process will be exemplified.

FIGS. 11A to 11G are views for explaining the gate process. Assume that a gate oxide film GO, gate material GM, and hard mask HM are formed in order from the substrate side on a silicon substrate ST. As shown in FIG. 11A, an exposure apparatus optically transfers a mask pattern (L/Ss) onto the silicon substrate ST, forming a resist pattern RP of the mask pattern. Since the maximum numerical aperture (NA) of the current exposure apparatus is 1.35, the L/S resolution limit is 0.25×(193/1.35)=36 nm. However, leading-edge devices require an L/S of 30 nm or less, and an L/S finer than 36 nm needs to be formed in practice. A case in which an L/S of 20 nm/20 nm is formed will be exemplified. More specifically, first, the resist pattern RP is formed at 20 nm/60 nm=L/S larger than the resolution limit of the exposure apparatus. Lithography of such an L/S is more difficult than lithography of 40 nm/40 nm=L/S at which the line and space pitches are equal. Therefore, after forming 40 nm/40 nm=L/S, the resist pattern may be isotropically etched by an oxygen plasma or the like to form 20 nm/60 nm=L/S.

Then, as shown in FIG. 11B, an oxide film OC is formed by spin coating, CVD, sputtering, or the like on the substrate on which the resist pattern RP has been formed. The thickness (film thickness) of the oxide film OC is set to be equal to the line width (20 nm) of an L/S to be formed on the silicon substrate ST. The oxide film OC formed on each side surface of the resist pattern RP is called a side wall. Since the oxide film OC is isotropically formed (deposited), the width of the side wall is equal to the thickness of the oxide film OC formed on the upper surface of the resist pattern RP. In other words, the width of the side wall becomes 20 nm, which is the line width of the L/S to be formed on the silicon substrate ST. Although the oxide film has been exemplified, the purpose of this process is to etch an underlying film, and the target film may be another film such as a carbon film.

After that, as shown in FIG. 11C, the oxide film OC is anisotropically etched until the surface of the resist pattern RP appears. As shown in FIG. 11D, the resist pattern RP is removed by an oxygen plasma. As a result, 20-nm L/Ss are formed by the side walls.

Thereafter, as shown in FIG. 11E, the hard mask HM is etched using the side walls as a mask. The gate material GM is etched using the pattern of the hard mask HM, as shown in FIG. 11F, and the hard mask HM is removed, as shown in FIG. 11G. Accordingly, L/Ss of 20 nm/20 nm are formed.

The exposure apparatus transfers, to a substrate, even a mark used for alignment or a mark used for overlay inspection after transferring a pattern. To align a pattern formed on a substrate and the pattern of a mask, the exposure apparatus detects an alignment mark formed on the substrate, and acquires the position (position information) of the pattern formed on the substrate. As a detection system which detects an alignment mark, an optical detection system which optically detects an alignment mark is employed in the arrangement of the exposure apparatus. Although the shape of the alignment mark is decided based on the specifications of the exposure apparatus, it is much larger than a device pattern so that the alignment mark can be optically detected. In many cases, in the detection system, bright field is used.

In overlay inspection, the second overlay mark (resist pattern) is formed in the overlay process on the first overlay mark formed in a preceding process, and the overlay state is inspected. Even in overlay inspection, an optical detection system is adopted in terms of processing ability, and bright field is used in many cases. As the overlay mark, a type in which a square second overlay mark OM2 is overlaid on a square first overlay mark OM1, as shown in FIG. 12A, has been used conventionally. Recently, a type in which the first overlay mark OM1 and second overlay mark OM2 are constituted by sets of small rectangles, as shown in FIG. 12B, has been proposed in "A. Ueno, 'Novel at Design Rule Via to Metal Overlay metrology for 193 nm lithography' IEEE Transactions on semiconductor manufacturing, Vol. 17, No. 3, August 2004".

To form an L/S finer than 36 nm, a side wall process of forming a side wall is necessary, as described above. FIG. 13A is a plan view showing resist patterns RP and side walls SW formed in a device pattern region PP and a mark region MP of an alignment mark or overlay mark. FIG. 13B is a sectional view showing the device pattern region PP. As described above, if the resist pattern RP is removed, only the side walls SW remain in the device pattern region PP and mark region MP, as shown in FIG. 14. Referring to FIG. 14, a mark such as an alignment mark or overlay mark formed in the mark region MP has a large shape, but only its periphery is constituted by the side wall SW, so the width becomes smaller than 36 nm. In this state, the mark cannot be detected optically.

To solve this, there is proposed a technique of, before forming a device, forming a mark on a silicon substrate by etching, and using this mark as an alignment mark or overlay mark in subsequent processes, as shown in FIG. 15.

However, when a mark formed on a silicon substrate is used, the mark formed on the silicon substrate intervenes in overlay inspection for two processes (that is, a mark formed in each process and the mark formed on the silicon substrate are compared). This is called indirect alignment. Along with micropatterning of recent devices, marks need to be directly aligned in an important process, and the accuracy is poor in indirect alignment. In addition, a device is constituted by many layers, and it becomes difficult to detect a mark formed on a silicon substrate in later processes.

SUMMARY OF THE INVENTION

The present invention provides a technique advantageous for forming a detection mark which is detectable by a detection system at high accuracy.

According to one aspect of the present invention, there is provided a method of forming a detection mark from a line pattern formed on a substrate, including a first step of deciding a first region for forming the detection mark on the substrate, and a second region which surrounds the first region and in which formation of the detection mark is forbidden, and a second step of projecting, onto the substrate by a projection optical system, patterns including a first cut pattern for partially cutting the line pattern in the first region to form a plurality of mark elements, and a removal pattern for removing the line pattern in the second region, and forming the detection mark including the plurality of mark elements.

Further aspects of the present invention will become apparent from the following description of exemplary embodiments with reference to the attached drawings.

BRIEF DESCRIPTION OF THE DRAWINGS

FIG. 3 is a view showing a device pattern and detection mark formed on the substrate shown in FIGS. 2A and 2B.

FIGS. 10A to 10C are views for explaining a 1D layout.

DESCRIPTION OF THE EMBODIMENTS

Figure 1:
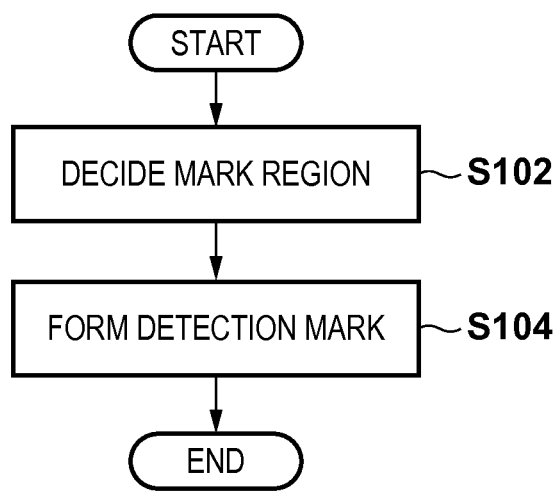
FIG. 1 is a flowchart for explaining a forming method in the first embodiment of the present invention.

Preferred embodiments of the present invention will be described below with reference to the accompanying drawings. Note that the same reference numerals denote the same members throughout the drawings, and a repetitive description thereof will not be given.

First Embodiment

The first embodiment will explain a forming method in which a detection mark such as an alignment mark to be used for alignment, or an overlay mark used for overlay inspection after transferring a pattern is formed using one-dimensional L/Ss forming a device pattern. The one-dimensional L/S is a line and space pattern including a line pattern and space pattern formed on a substrate. When detecting this detection mark by a bright-field detection system, the first- or higher-order diffracted light diffracted by the one-dimensional L/Ss does not enter the pupil of the detection system because the one-dimensional L/Ss are fine patterns. The one-dimensional L/Ss are partially cut (divided) so that diffracted light in a direction perpendicular to the one-dimensional L/Ss (a direction in which the line patterns of the one-dimensional L/Ss extend) does not enter the pupil of the detection system.

FIG. 1 is a flowchart for explaining a forming method in the first embodiment of the present invention. This forming method forms a detection mark from a line pattern and a space pattern which are formed on a substrate. As described above, the detection mark includes an alignment mark and overlay mark.

In step S102, a mark region including a mark forming region (first region) in which a detection mark on a substrate is formed, and a mark forbidden region (second region) which surrounds the mark forming region and in which formation of a detection mark is forbidden is decided in accordance with a detection system which optically detects a detection mark. In other words, the detection mark size (mark forming region) necessary to detect a mark by a detection system which detects a detection mark, such as an alignment detection system or overlay detection system, and the peripheral region (mark forbidden region) are decided.

In step S104, a detection mark is formed in the mark region decided in step S102. More specifically, the projection optical system of the exposure apparatus projects a pattern, including cut patterns (first cut patterns) and a removal pattern, to the mark region decided in step S102 on the substrate. The line pattern on the substrate are cut, forming a detection mark. The cut pattern is a pattern for partially cutting a line pattern in a mark forming region on a substrate to form a plurality of mark elements. The removal pattern is a pattern (figure) for removing a line pattern in a mark forbidden region on a substrate. Hence, a plurality of mark elements are formed in the mark region on the substrate, and form a detection mark.

Note that the pitch between the plurality of mark elements in a direction in which the line pattern extend is designed to be larger than a pitch at which the exposure apparatus can resolve a pattern, and smaller than a pitch at which the detection system can detect a mark. In other words, the pitch between the plurality of mark elements is larger than a minimum pitch necessary for, of light diffracted by a detection mark, the first- or higher-order diffracted light to enter the pupil of the projection optical system of the exposure apparatus, and smaller than a minimum pitch necessary for the first- or higher-order diffracted light to enter the pupil of the detection system.

Step S104 is performed in parallel to (that is, at the same time as) a step of forming a device pattern in a device pattern region. The device pattern region is, for example, a region excluding a mark region on a substrate. The device pattern is formed by projecting, onto a substrate by the projection optical system of the exposure apparatus, cut patterns (second cut patterns) for partially cutting a line pattern in a pattern region on the substrate.

The above-described forming method will be explained in detail below. A case in which a given process is overlaid on another process, for example, a case in which a contact process is overlaid on a gate process will be explained. A detection mark is formed in the gate process, and a gate serving as a device pattern is constituted by a 1D layout.

Figure 2A:
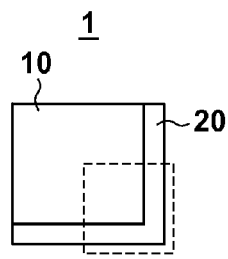
FIGS. 2A and 2B are views showing a substrate including a device pattern region and a dicing line.
Figure 2B:
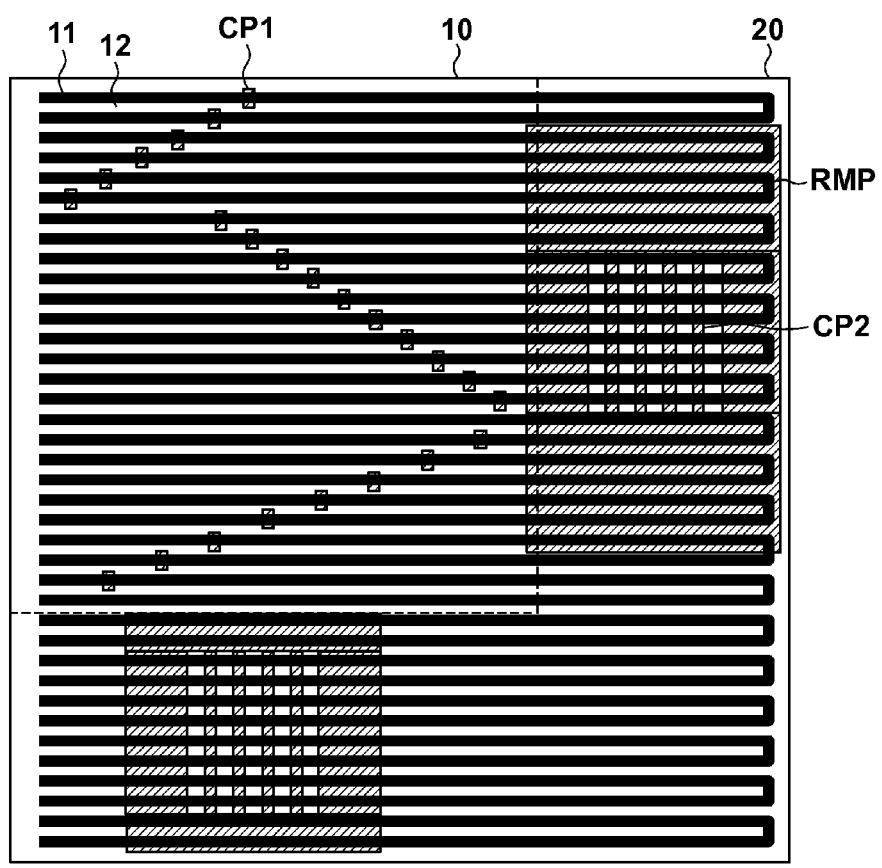

FIG. 2A is a view showing a substrate 1 including a device pattern region 10 and dicing line 20. FIG. 2A shows one chip. FIG. 2B is an enlarged view showing a rectangular region indicated by a dotted line in FIG. 2A. As shown in FIG. 2B, line and space patterns including a line pattern 11 and space patterns 12 are formed on the entire surface of the chip. The line and space patterns are formed using, as a core, one-dimensional L/Ss constituted by a resist pattern (that is, by a side wall process). At the end of the chip, side walls are connected. If no pattern need be formed on the dicing line 20, the dicing line 20 does not require the one-dimensional L/Ss constituted by side walls. In the embodiment, however, a detection mark is formed on the dicing line 20 by using the one-dimensional L/Ss constituted by side walls. For this purpose, the one-dimensional L/Ss constituted by side walls are formed even on the dicing line 20.

A cutting process is performed on the substrate 1 shown in FIGS. 2A and 2B. More specifically, the exposure apparatus (projection optical system) projects cut patterns CP1 to the pattern region 10 shown in FIG. 2B, thereby forming a device pattern. Parallel to this, the exposure apparatus (projection optical system) projects, onto the dicing line 20 shown in FIG. 2B, patterns each including cut patterns CP2 and a removal pattern RMP, thereby forming detection marks.

FIG. 3 is a view showing a device pattern 13 formed in the pattern region 10, and the dicing line 20, more specifically, detection marks 22 each formed in a mark region 21 upon completion of the cutting process. As described above, each mark region 21 including a mark forming region 21a and mark forbidden region 21b is decided in accordance with the detection system which detects the detection mark 22. Based on the mark region 21, the detection mark 22 is formed. The detection mark 22 is formed by partially cutting the line pattern 11 in the mark forming region 21a in accordance with the cut patterns CP2, and removing the line pattern 11 in the mark forbidden region 21b in accordance with the removal pattern RMP. Thus, the detection mark 22 is constituted by a plurality of mark elements 22a.

A pitch Po between the plurality of mark elements 22a in a direction in which the line pattern 11 extend is defined by Pexp<Po<Pdet. Pexp is a minimum pitch necessary for, of light diffracted by the detection mark 22, the first- or higher-order diffracted light to enter the pupil of the projection optical system of the exposure apparatus. Pdet is a minimum pitch necessary for, of light diffracted by the detection mark 22, the first- or higher-order diffracted light to enter the pupil of the detection system which detects the detection mark 22.

Since Pexp<Po, the first- or higher-order diffracted light can enter the pupil of the projection optical system of the exposure apparatus, in addition to the 0th-order diffracted light. The exposure apparatus can therefore transfer the cut patterns CP2 onto the dicing line 20. As for light diffracted in a direction parallel to the direction in which the line pattern 11 of the one-dimensional L/Ss extend, since Po<Pdet, only the 0th-order diffracted light enters the pupil of the detection system. Light diffracted in the direction perpendicular to the direction in which the line pattern 11 of the one-dimensional L/Ss extend is decided by the pitch between the one-dimensional L/Ss constituted by side walls. This pitch is a pitch which cannot be formed even by the exposure apparatus. Thus, the first- or higher-order diffracted light does not enter the pupil of the detection system that is smaller than the pupil of the projection optical system of the exposure apparatus.

Figure 4:
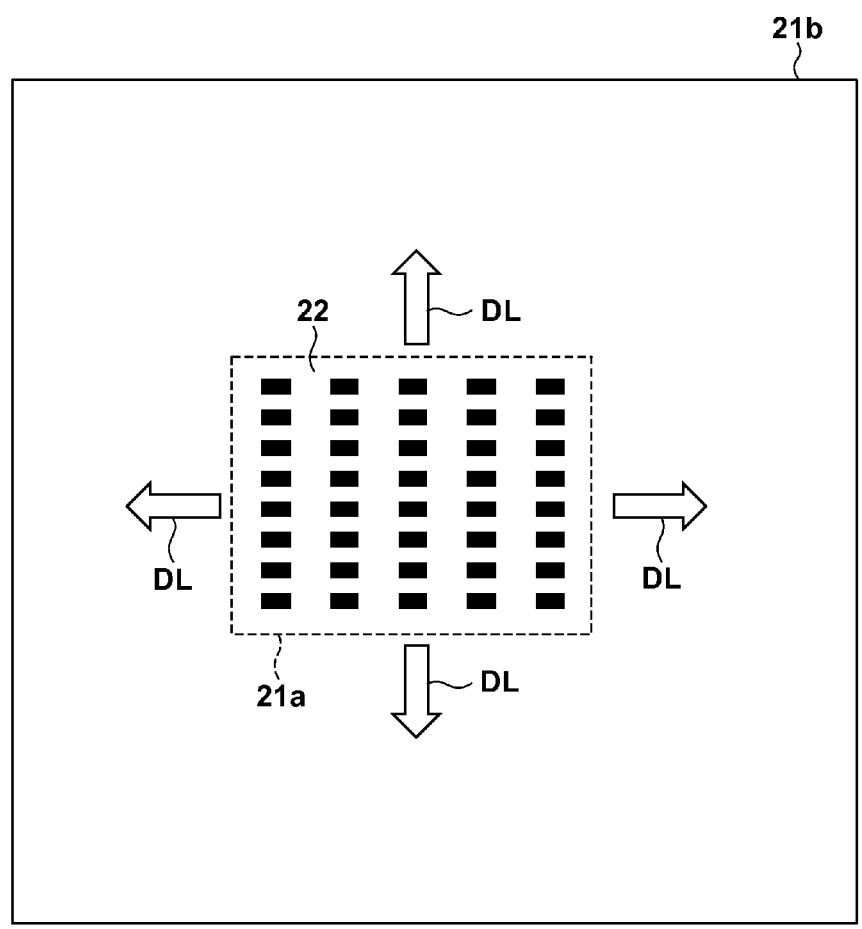
FIG. 4 is a view showing light diffracted by the detection mark shown in FIG. 3.

Because of these phenomena, of diffracted light DL traveling from the detection mark 22 in two directions respectively perpendicular to and parallel to the direction in which the line pattern 11 of the one-dimensional L/Ss extend, only the 0th-order light enters the pupil of the detection system, as shown in FIG. 4. Since no mark is formed in the mark forbidden region 21b serving as the peripheral region of the detection mark 22, all diffracted light enters the pupil of the detection system. When the detection mark 22 is detected by the bright-field detection system, it is detected as a mark which is dark in two perpendicular directions and has a brightness contrast. Note that the diffraction angle θ of the nth-order diffracted light is decided from a relation of P·NA=n·λ (P=pitch, NA=sin θ, λ=wavelength).

The gate process has been exemplified. However, in a process using a 1D layout, the aforementioned forming method is applicable. A high-contrast detection mark can be formed in a necessary process.

The cut pattern CP2 which partially cuts the line pattern 11 of the one-dimensional L/Ss has been described as a rectangular pattern extending in the direction perpendicular to the direction in which the line pattern 11 extend, and crossing all the line pattern 11, in order to increase the dimensions (shape) of the cut pattern CP2 so that the cut pattern CP2 can be resolved easily.

Figure 5A:
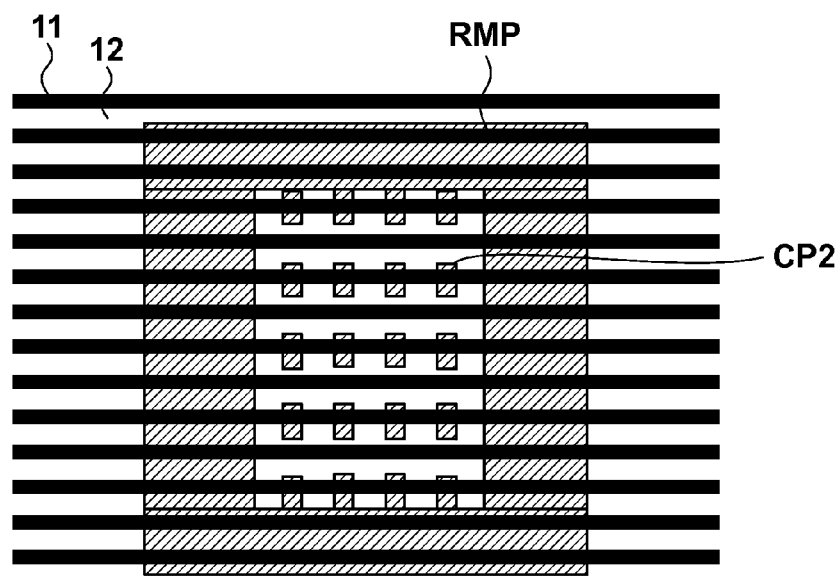
FIGS. 5A and 5B are views showing an example of cut patterns for forming a detection mark and a detection mark to be formed on a substrate.
Figure 5B:
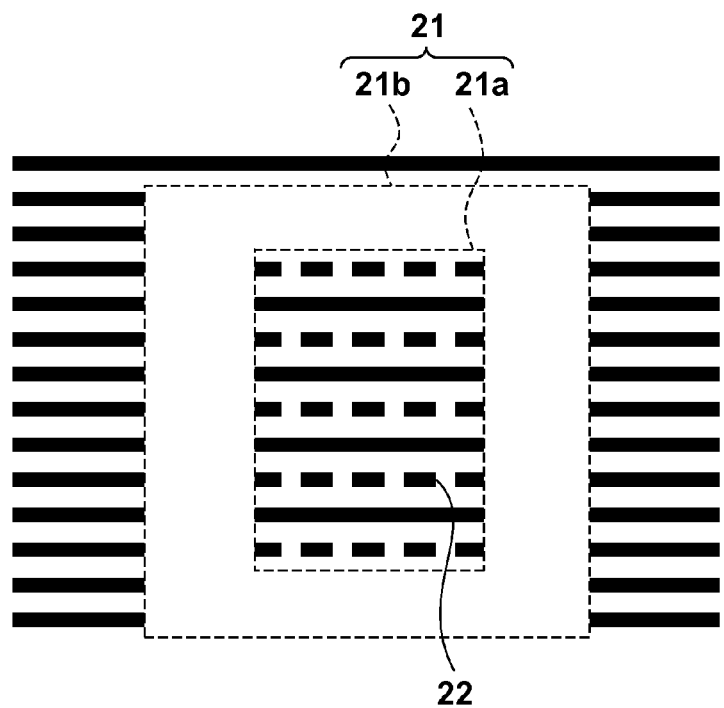

The cut pattern CP2 may be identical to the cut pattern CP1. In other words, the cut pattern CP2 may be a rectangular pattern group crossing some line pattern 11 in the direction perpendicular to the direction in which the line pattern 11 extend, as shown in FIG. 5A. In this case, the cut pattern CP2 cannot be arranged for each line pattern owing to the restriction of the resolution. Thus, the cut patterns CP2 are arranged while skipping one or more line pattern 11. FIG. 5B is a view showing the detection mark 22 formed in the mark region 21 upon completion of the cutting process (that is, by projecting the cut patterns CP2 shown in FIG. 5A onto the substrate). Since the cut pattern CP2 shown in FIG. 5A has the same shape as that of the cut pattern CP1 for forming the device pattern 13, the processing dimensional property is improved. This is because exposure conditions and the like in the exposure apparatus are optimized to the cut pattern CP1 for forming the device pattern 13. If the projection optical system of the exposure apparatus has aberration, misalignment is generated in a pattern to be transferred onto a substrate. If the cut pattern CP1 for forming the device pattern 13 and the cut pattern CP2 for forming the detection mark 22 are different, relative misalignment is generated and acts as an error. To the contrary, if the cut patterns CP1 and CP2 are identical, this problem does not occur. In the detection mark 22 shown in FIG. 5B, the number of mark elements which generate diffracted light in the direction in which the line pattern 11 extend is halved, and the intensity of the diffracted light is also halved. However, the contrast with the 0th-order light is sufficient, and the diffracted light can function as the detection mark 22.

Figure 6A:
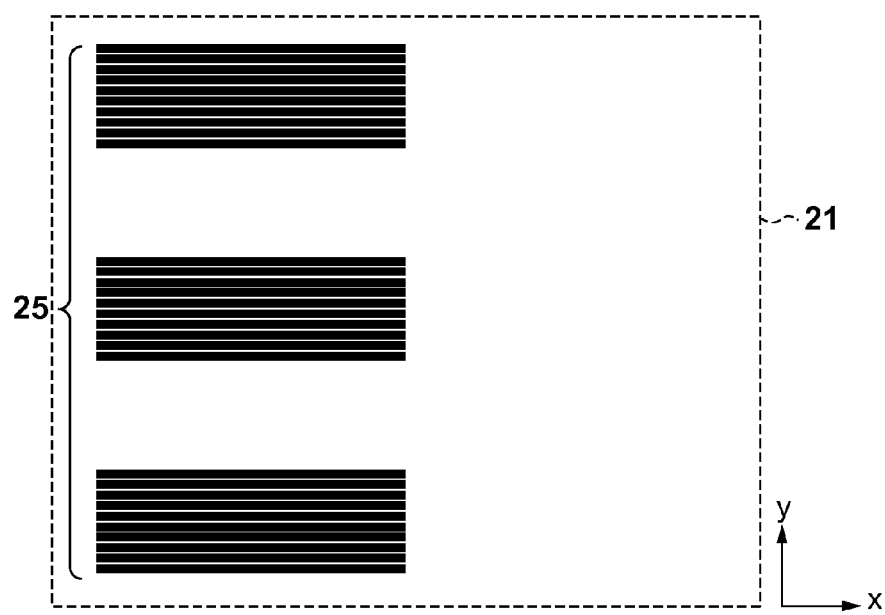
FIGS. 6A and 6B are views showing an example of overlay marks (detection marks) each constituted by a set of small rectangles.

The embodiment is also applicable to a case in which an overlay mark serving as the detection mark 22 is constituted by a set of small rectangles. In this case, as the overlay mark, a horizontally elongated mark group which decides the y position and has the longitudinal direction in the horizontal direction, and a vertically elongated mark group which decides the x position and has the longitudinal direction in the vertical direction are formed. Here, the direction in which the line pattern 11 of the one-dimensional L/Ss extend will be explained as the x direction. A horizontally elongated mark group 25 which decides the y position is a mark as shown in FIG. 6A. Before forming the horizontally elongated mark group 25, one-dimensional L/Ss constituted by side walls are formed on the entire surface of the mark region 21 indicated by a dotted line. Thus, cut patterns CP2 which leave only the line pattern 11 corresponding to the horizontally elongated mark group 25 are projected, forming the horizontally elongated mark group 25. Since the horizontally elongated mark group 25 is formed from side walls, the first- or higher-order diffracted light in the y direction does not enter the pupil of the detection system. Therefore, the detection system detects the horizontally elongated mark group 25 as three horizontally elongated marks. However, the horizontally elongated mark group 25 may be configured so that the detection system detects it as three or more horizontally elongated marks.

Figure 6B:
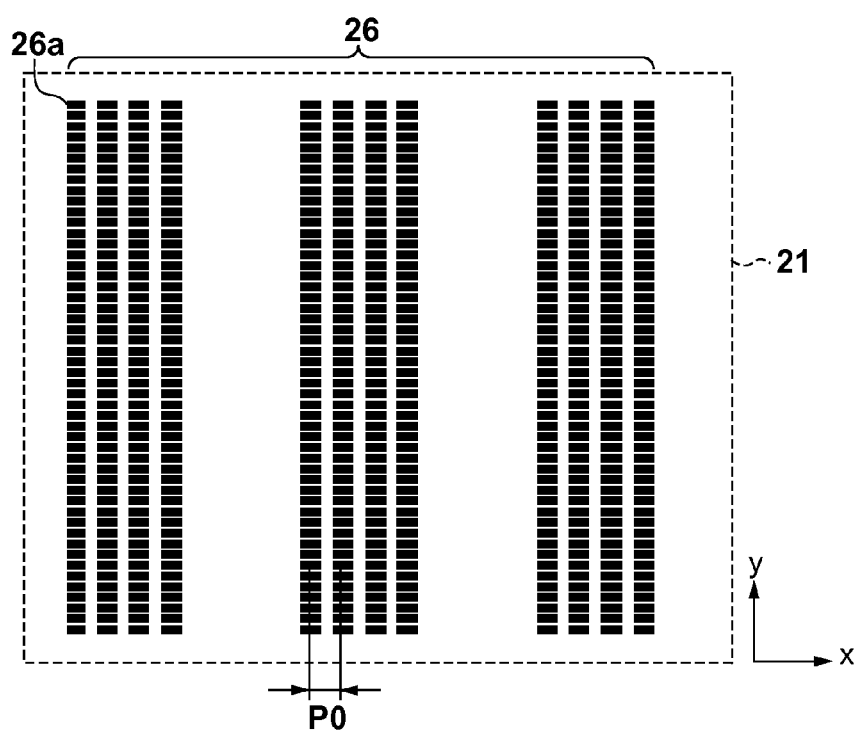

A vertically elongated mark group 26 which decides the x position is a mark as shown in FIG. 6B. Before forming the vertically elongated mark group 26, one-dimensional L/Ss constituted by side walls are formed on the entire surface of the mark region 21 indicated by a dotted line. Cut patterns CP2 which leave only the line pattern 11 corresponding to the vertically elongated mark group 26 are projected, thereby forming the vertically elongated mark group 26. As for the horizontally elongated mark group 25, it is only necessary to simply form small horizontally elongated marks, as shown in FIG. 6A. In contrast, as for the vertically elongated mark group 26, a vertically elongated mark needs to be formed from a plurality of mark elements 26a, as shown in FIG. 6B, and the pitch between the plurality of mark elements 26a in the direction in which the line pattern 11 extend needs to satisfy the pitch Po. With this setting, the first- or higher-order diffracted light in the x direction does not enter the pupil of the detection system. The detection system detects the vertically elongated mark group 26 as three vertically elongated marks. In FIG. 6B, the vertically elongated mark is divided into four columns. However, considering the size of a normal mark, the vertically elongated mark is divided into a larger number of columns. The vertically elongated mark group 26 may be configured so that the detection system detects it as three or more vertically elongated marks.

Second Embodiment

Figure 7:
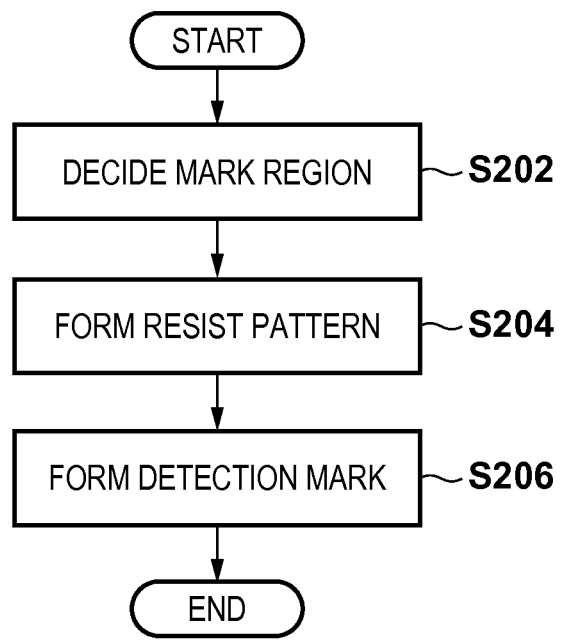
FIG. 7 is a flowchart for explaining a forming method in the second embodiment of the present invention.

FIG. 7 is a flowchart for explaining a forming method in the second embodiment of the present invention. This forming method forms a detection mark on a substrate on which a line pattern and a space pattern are formed.

In step S202, as in step S102, a mark region including a mark forming region (first region) in which a detection mark on a substrate is formed, and a mark forbidden region (second region) which surrounds the mark forming region and in which formation of a detection mark is forbidden is decided in accordance with a detection system which optically detects a detection mark.

In step S204, a resist pattern is formed in the mark region decided in step S202. More specifically, the projection optical system of an exposure apparatus projects, to the mark region decided in step S202 on the substrate, a pattern including a plurality of mark elements arrayed in a direction in which a line pattern to be formed on the substrate extend. As a result, a plurality of resist patterns corresponding to the respective mark elements are formed in the mark forming region. However, the plurality of mark elements may also be arrayed in a direction perpendicular to the direction in which a line pattern to be formed on the substrate extend.

Note that the pitch between the plurality of mark elements in the direction in which a line pattern extend is designed to be larger than a pitch at which the exposure apparatus can resolve a pattern, and smaller than a pitch at which the detection system can detect a mark. In other words, the pitch between the plurality of mark elements is larger than a minimum pitch necessary for, of light diffracted by the detection mark, the first- or higher-order diffracted light to enter the pupil of the projection optical system of the exposure apparatus, and smaller than a minimum pitch necessary for the first- or higher-order diffracted light to enter the pupil of the detection system.

Step S204 is performed in parallel to (that is, at the same time as) a step of projecting one-dimensional L/Ss corresponding to a line pattern and a space pattern by the projection optical system of the exposure apparatus, and forming the resist patterns of the one-dimensional L/Ss.

In step S206, side walls are formed on the side surfaces of the respective resist patterns formed in step S204. Then, the plurality of resist patterns are removed, forming a detection mark from the side walls.

The above-described forming method will be explained in detail below. A case in which cut patterns are overlaid on one-dimensional L/Ss in a process of forming a one-dimensional L/S based on a 1D layout will be explained.

Figure 8:
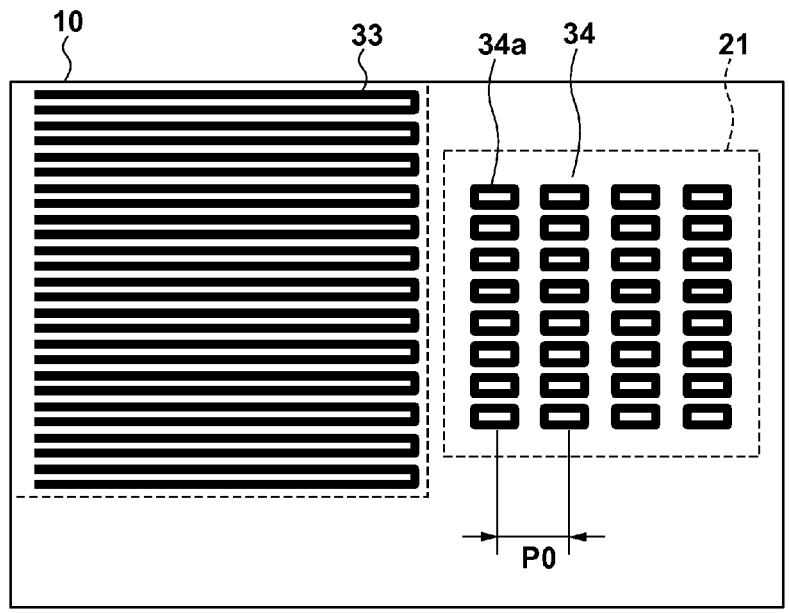
FIG. 8 is a view showing one-dimensional L/Ss and a detection mark which are formed on a substrate.

FIG. 8 is a view showing one-dimensional L/Ss 33 formed in a pattern region 10, and a dicing line, more specifically, a detection mark 34 formed in a mark region 21 after the side wall process of forming side walls on the side surfaces of resist patterns. Regions (blank regions) between the one-dimensional L/Ss 33 constituted by the side walls, and regions (blank regions) inside mark elements 34a of the detection mark 34 that are constituted by the side walls are regions formed using the resist patterns as a core. The projection optical system of the exposure apparatus projects, onto the substrate, patterns forming such resist patterns, and forms side walls on the side surfaces of the resist patterns. By removing the resist patterns, the one-dimensional L/Ss 33 and detection mark 34 are formed from the side walls. The pitch between the plurality of mark elements 34a in the direction in which the line pattern of the one-dimensional L/Ss 33 extend satisfies a pitch Po defined in the first embodiment. Also, the pitch between the plurality of mark elements 34a in the direction perpendicular to the direction in which the line pattern of the one-dimensional L/Ss 33 extend also satisfies the pitch Po. Thus, light components diffracted in the x and y directions by the detection mark 34 become the same as those diffracted by the detection mark 22 in the first embodiment (that is, the diffraction states become the same), and function as the detection mark. The second embodiment is different from the first embodiment in that the detection mark 34 is formed by forming side walls on the side surfaces of partially cut resist patterns, instead of forming the detection mark 22 by partially cutting one-dimensional L/Ss based on cut patterns.

The pitch between the mark elements 34a in the direction perpendicular to the direction in which the line pattern of the one-dimensional L/Ss 33 extend is not decided by the pitch between the one-dimensional L/Ss 33, and need not always coincide with the pitch between the one-dimensional L/Ss 33. However, it is advantageous in terms of the resolution and the influence of aberration in the exposure apparatus, to make the pitch between the mark elements 34a in the direction perpendicular to the direction in which the line pattern of the one-dimensional L/Ss 33 extend, coincide with the pitch between the one-dimensional L/Ss 33.

Figure 9:
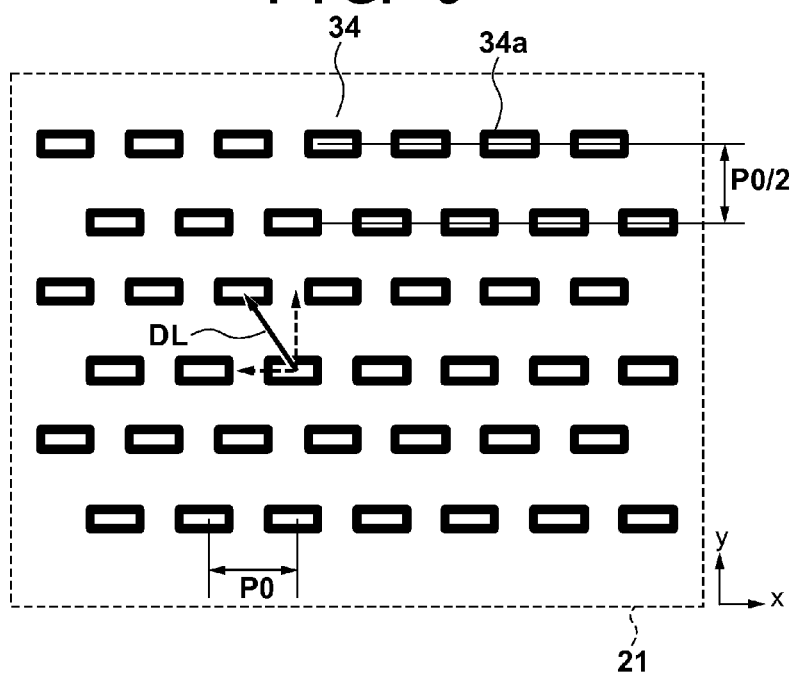
FIG. 9 is a view showing a detection mark formed on a substrate.
Figure 11D:
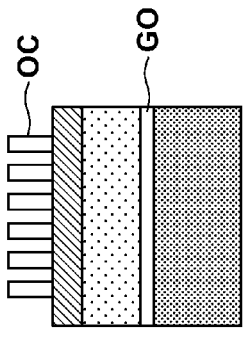
FIGS. 11A to 11G are views for explaining a gate process.
Figure 11C:
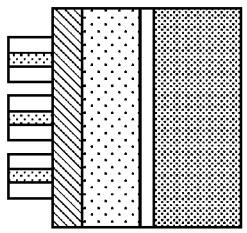
Figure 11B:
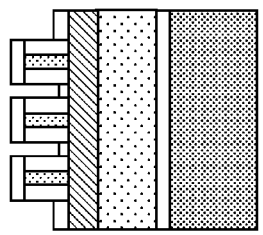
Figure 11A:
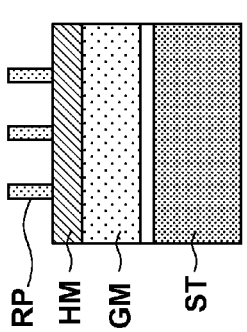
Figure 11G:
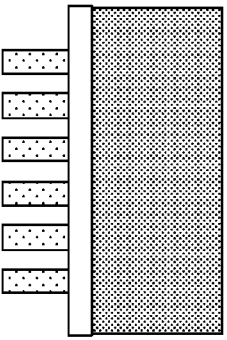
Figure 11F:
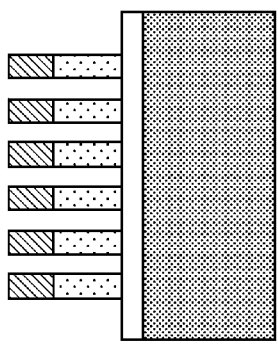
Figure 11E:
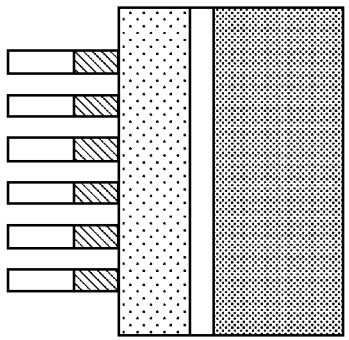
Figure 12A:
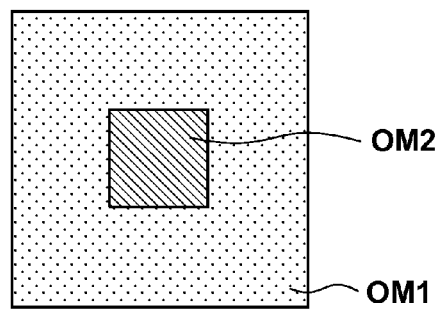
FIGS. 12A and 12B are views showing an example of overlay marks.
Figure 12B:
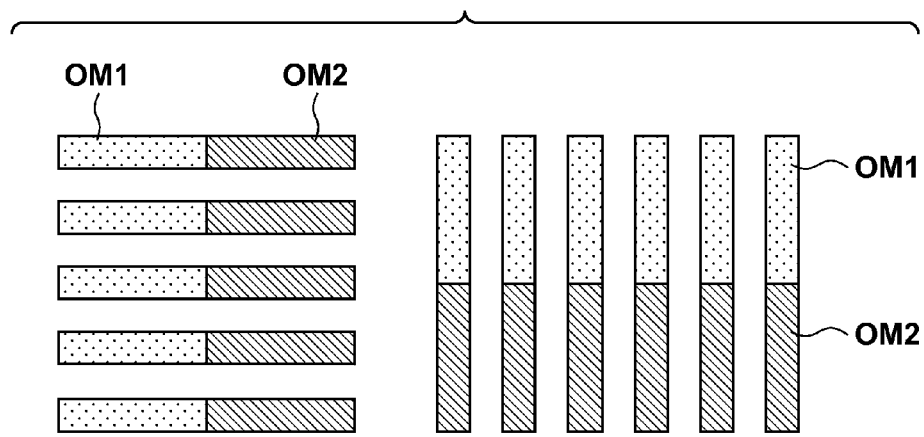
Figure 13A:
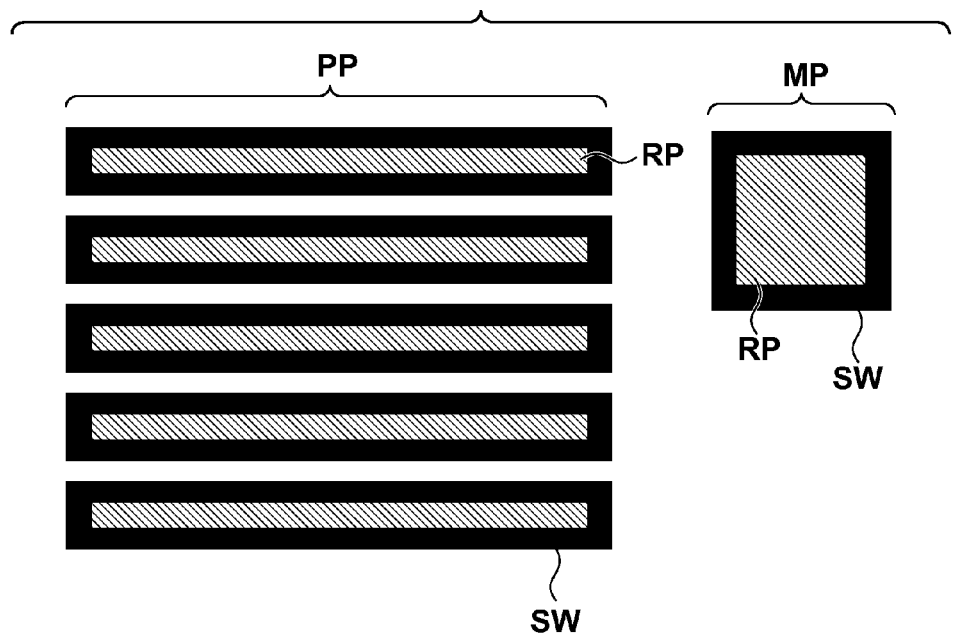
FIGS. 13A and 13B are views showing a resist pattern and side wall formed in a device pattern region and mark region.
Figure 13B:
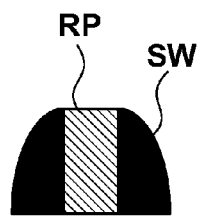
Figure 14:
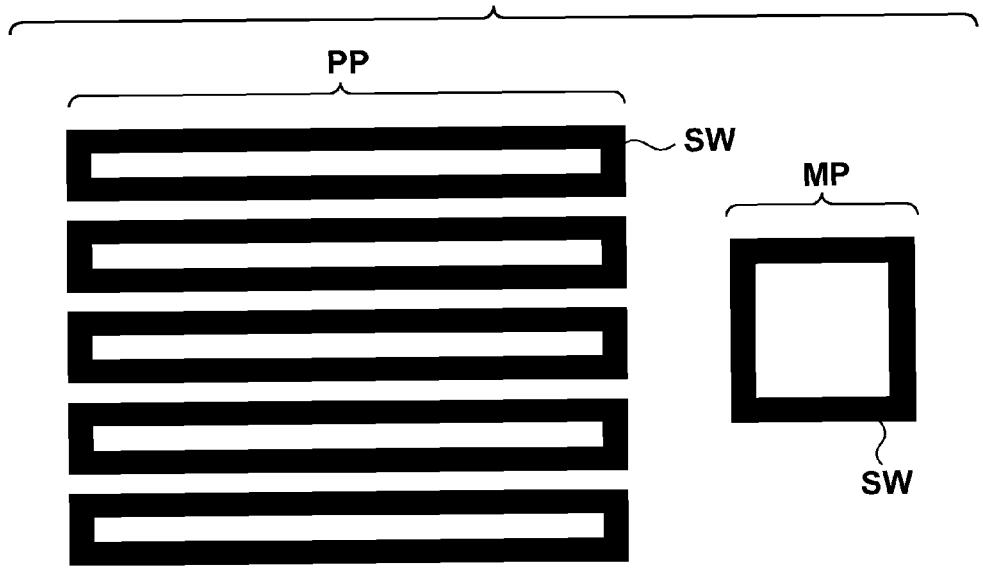
FIG. 14 is a plan view showing side walls remaining in the device pattern region and mark region.
Figure 15:
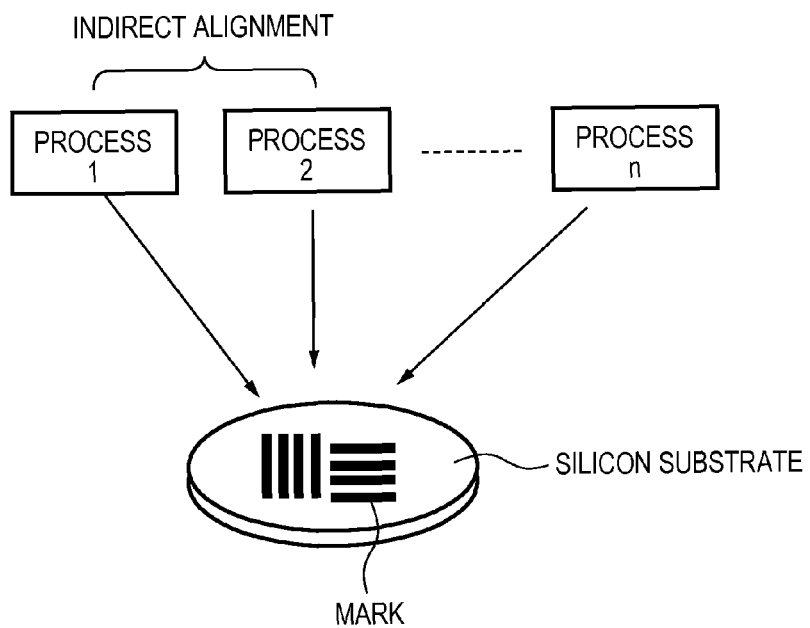
FIG. 15 is a view for explaining indirect alignment.

In FIG. 8, the plurality of mark elements 34a constituting the detection mark 34 are arrayed in a matrix in the direction in which the line pattern of the one-dimensional L/Ss 33 extend, and the direction perpendicular to the direction in which the line pattern extend. However, the plurality of mark elements 34a are not limited to them. For example, as shown in FIG. 9, the plurality of mark elements 34a constituting the detection mark 34 may be arrayed in a staggered shape in the direction in which the line pattern of the one-dimensional L/Ss 33 extend, and the direction perpendicular to the direction in which the line pattern extend. A detection mark 34 shown in FIG. 9 obliquely diffracts diffracted light. When this diffracted light is split into orthogonal components, the pitch at which the diffracted light DL is generated is Po/2 in the x direction and Po in the y direction. This satisfies the condition that the first- or higher-order diffracted light does not enter the pupil of the detection system.

In this manner, according to the forming method of each embodiment, a detection mark such as an alignment mark or overlay mark detectable at high accuracy by an alignment detection system or overlay detection system can be formed.

A substrate having a detection mark formed according to the forming method of each embodiment, or a substrate having a detection mark including a plurality of mark elements arrayed in the direction (first direction) in which the line pattern of one-dimensional L/Ss extend also constitutes one aspect of the present invention. In this case, the pitch between the plurality of mark elements in the first direction needs to satisfy the pitch Po, as described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-143895 filed on Jul. 9, 2013, which is hereby incorporated by reference herein in its entirety.

What is claimed is:

1. A method of forming a detection mark from a line pattern formed on a substrate, comprising:
   a first step of deciding a first region for forming the detection mark on the substrate, and a second region which surrounds the first region and in which formation of the detection mark is forbidden; and
   a second step of projecting, onto the substrate by a projection optical system, patterns including a first cut pattern for partially cutting the line pattern in the first region to form a plurality of mark elements, and a removal pattern for removing the line pattern in the second region, and forming the detection mark including the plurality of mark elements.

2. The method according to claim 1, wherein a pitch between the plurality of mark elements in a direction in which the line pattern extend is larger than a minimum pitch necessary for, of light diffracted by the detection mark, diffracted light of not less than first order to enter a pupil of the projection optical system, and smaller than a minimum pitch necessary for the diffracted light of not less than the first order to enter a pupil of a detection system configured to optically detect the detection mark.

3. The method according to claim 1, wherein
   a plurality of lines are repetitively formed on the substrate in a direction perpendicular to a direction in which the line pattern extend, and
   the first cut pattern includes a rectangular pattern extending in the direction perpendicular to the direction in which the line pattern extend, and crossing all of the lines of the line pattern in the first region.

4. The method according to claim 1, wherein
   a plurality of lines are repetitively formed on the substrate in a direction perpendicular to a direction in which the line pattern extend, and
   the first cut pattern includes a rectangular pattern group extending in the direction perpendicular to the direction in which the line pattern extend, and crossing a part of the lines of the line pattern in the first region.

5. The method according to claim 1, wherein the second step is performed in parallel to a step of forming a pattern by projecting, onto the substrate by the projection optical system, a second cut pattern for partially cutting the line pattern in a pattern region excluding the first region and the second region on the substrate.

6. The method according to claim 1, wherein the detection mark includes one of an alignment mark and an overlay mark.

7. A method of forming a detection mark on a substrate on which line pattern is formed, comprising:
   a first step of deciding a first region for forming the detection mark on the substrate, and a second region which surrounds the first region and in which formation of the detection mark is forbidden;
   a second step of projecting, to the first region and the second region by a projection optical system, a pattern including a plurality of mark elements arrayed in a direction in which the line pattern extend, and forming a plurality of resist patterns corresponding to the respective mark elements in the first region; and
   a third step of forming side walls on side surfaces of the respective resist patterns formed in the second step, and removing the plurality of resist patterns to form the detection mark including the side walls.

8. The method according to claim 7, wherein the second step is performed in parallel to a step of projecting a line and space pattern by the projection optical system to a pattern region excluding the first region and the second region on the substrate, and forming a resist pattern of the line and space pattern.

9. The method according to claim 7, wherein
   the plurality of mark elements are arrayed even in a direction perpendicular to a direction in which the line pattern extend, and
   the plurality of mark elements are arrayed in a matrix in the direction in which the line pattern extend, and the direction perpendicular to the direction in which the line pattern extend.

10. The method according to claim 7, wherein
    the plurality of mark elements are arrayed even in a direction perpendicular to a direction in which the line pattern extend, and
    the plurality of mark elements are arrayed in a staggered shape in the direction in which the line pattern extend, and the direction perpendicular to the direction in which the line pattern extend.

11. The method according to claim 7, wherein the detection mark includes an alignment mark or an overlay mark.

12. A substrate comprising a detection mark,
    wherein the detection mark includes a plurality of mark elements arrayed in a first direction, and
    a pitch between the plurality of mark elements in the first direction is larger than a minimum pitch necessary for, of light diffracted by the detection mark, diffracted light of not less than first order to enter a pupil of a projection optical system configured to project a pattern to the substrate, and smaller than a minimum pitch necessary for the diffracted light of not less than the first order to enter a pupil of a detection system configured to optically detect the detection mark.

13. A substrate comprising a detection mark formed by a method of forming a detection mark from line pattern formed on a substrate, the forming method including:
    a first step of deciding a first region for forming the detection mark on the substrate, and a second region which surrounds the first region and in which formation of the detection mark is forbidden; and
    a second step of projecting, onto the substrate by a projection optical system, patterns including a first cut pattern for partially cutting the line pattern in the first region to form a plurality of mark elements, and a removal pattern for removing the line pattern in the second region, and forming the detection mark including the plurality of mark elements.

14. A substrate comprising a detection mark formed by a method of forming a detection mark from line pattern formed on a substrate, the forming method including:
- a first step of deciding a first region for forming the detection mark on the substrate, and a second region which surrounds the first region and in which formation of the detection mark is forbidden;
- a second step of projecting, to the first region and the second region by a projection optical system, a pattern including a plurality of mark elements arrayed in a direction in which the line pattern extend, and forming a plurality of resist patterns corresponding to the respective mark elements in the first region; and
- a third step of forming side walls on side surfaces of the respective resist patterns formed in the second step, and removing the plurality of resist patterns to form the detection mark including the side walls.

* * * * *